United States Patent

Bell et al.

Patent Number: 5,820,672
Date of Patent: Oct. 13, 1998

[54] OISF CONTROL IN CZOCHRALSKI-GROWN CRYSTALS

[75] Inventors: Weldon J. Bell, Frisco; H. Michael Grimes, Plano, both of Tex.

[73] Assignee: Texas Instruments Incorporated, Dallas, Tex.

[21] Appl. No.: 239,486

[22] Filed: May 9, 1994

[51] Int. Cl.⁶ .................................................. C30B 15/22
[52] U.S. Cl. .......................................................... 117/20
[58] Field of Search ............................ 117/13, 20, 200, 117/201, 202, 208, 916, 942, 944

[56] References Cited

U.S. PATENT DOCUMENTS 4,040,895 8/1977 Patrick et al. ............................ 117/20
4,417,943 11/1983 Jacques et al. .......................... 117/916

Primary Examiner—R. Bruce Breneman
Assistant Examiner—Felisa Garrett
Attorney, Agent, or Firm—Robby T. Holland; W. James Brady, III; Richard L. Donaldson

[57] ABSTRACT

A method for controlling oxygen-induced stacking faults (OISF) in a silicon crystal (12) grown according to the Czochralski silicon crystal growing technique includes the steps of forming a flared top portion (18) of the silicon crystal (12) to a predetermined diameter (20) and tapering (23) the silicon crystal (12) top portion (18) to produce a cylindrical portion (22) having a second predetermined diameter. The second predetermined diameter is smaller than the first predetermined diameter. Because of the inward taper (23) OISF concentrates in the flared top portion (18) of silicon crystal (12).

8 Claims, 4 Drawing Sheets

CRYSTAL TAPER

CRYSTAL TAPER

OISF CONTROL IN CZOCHRALSKI-GROWN CRYSTALS

TECHNICAL FIELD OF THE INVENTION

The present invention relates in general to semiconductor device fabrication processes and, more particularly, to a method for controlling oxygen-induced stacking faults (OISF) in silicon crystals grown according to the Czochralski silicon crystal growing technique.

BACKGROUND OF THE INVENTION

Silicon crystals, as used herein, are cylindrical blocks of pure silicon that semiconductor device manufacturers use to form semiconductor wafers. The manufacturers form the wafers by very carefully and precisely slicing the silicon crystal to produce a flat, mostly circular, thin piece of silicon. A common technique for growing a silicon crystal is known as the Czochralski technique. The Czochralski technique places a silicon seed in a susceptor or heated container filled with molten silicon. The technique is to withdraw the seed from the molten silicon while rotating the seed and susceptor and cooling the silicon that attaches to the seed. The combination of slowly withdrawing the seed, rotating the seed and susceptor, and cooling the silicon that adheres to the seed controllably grows the silicon crystal and permits precise determination of the crystal's diameter and length.

A problem in the Czochralski technique is to control oxygen concentrations in the silicon crystal. A major problem of having oxygen in the silicon crystal is known as oxygen-induced stacking fault or OISF. OISF occurs due to oxygen micro-defects that occur in the crystal. There are some beneficial effects of having a small amount of oxygen in the silicon crystal. For example, a controlled amount of precipitation of small oxygen clusters has the beneficial, metal-gettering effect of forming dislocation angles in the crystal lattice where the molecular oxygen precipitates. There are, however, difficulties in achieving an optional combination of the benefits of oxygen precipitation and freedom from OISF. These difficulties are compounded by other requirements in manufacturing silicon wafers, such as that the silicon be dislocation-free and that the resistivity, resistivity gradients, oxygen concentration, oxygen gradients, and the crystal diameter be within certain ranges. Therefore, deriving the beneficial effects from a small amount of oxygen, however, is quickly overcome by the detrimental effects that OISF causes in the crystal as well as the necessary monitoring and control of process parameters.

The problems that OISF and too much oxygen precipitation cause in the resulting electronic circuit include interruptions in electronic device operation as well as changes in signal properties. Because of these and other problems, generally it is necessary that silicon crystals be free of oxygen micro-defects, including oxygen precipitation. As a result of both OISF and oxygen precipitation, it is often necessary to discard as much as two-thirds of a silicon crystal. That is, in the fabrication of a silicon crystal, OISF may cause a loss of as much as one-third of the top portion of the silicon ingot. Oxygen precipitation defects, in addition, may cause a loss of as much as the bottom third of the silicon crystal. Since the typical preparation time for silicon crystal can be 25 hours, if as much as 50% or more of the silicon crystal must be discarded, or at best recycled, a significant loss in efficiency and productivity occurs using known techniques that employ the existing Czochralski silicon crystal growing techniques.

In silicon crystals grown by the Czochralski technique, for example, the silicon melt temperature and the morphology of the interface between the molten silicon and the growing crystal are important considerations that determine the crystal purity. Although it is well-known that OISF can occur in silicon crystals grown by the Czochralski technique, there is no known method or system that controls OISF in single silicon crystals.

The problem with oxygen precipitation is that it causes dislocation faults in the bottom portion of the silicon crystal that requires pure default-free silicon. U.S. patent application Ser. No. (TI-19058), by W. Bell, et al, entitled "Oxygen Precipitation Control in Czochralski-Grown Silicon Crystals" (hereinafter W. Bell), assigned to Texas Instruments Incorporated and filed on May 6, 1994, addresses the oxygen precipitation problem and is here incorporated by reference.

SUMMARY OF THE INVENTION

There is a need for a method and system that eliminate or control OISF in the formation of silicon crystals formed by the Czochralski crystal growing technique.

There is a need for a method to produce a silicon crystal that eliminates the need to crop or cut off significant portions of the resulting silicon crystal due to OISF defects.

The method of the present invention includes the steps of controlling or eliminating OISF in the formation of silicon crystals to eliminate or reduce limitations associated with known methods that use the Czochralski silicon crystal growing technique. The present invention provides a method for controlling the growth of a silicon crystal in such a way as to reduce or eliminate OISF defects and the resultant integrated circuit device problems that OISF causes.

The present invention, accordingly, forms a flared top portion of the silicon crystal to a predetermined diameter and tapers the silicon crystal top portion to produce a cylindrical portion that has a second predetermined diameter. The second predetermined diameter is smaller than the first predetermined diameter. An inwardly tapered portion connects the top portion to the cylindrical portion. This change in diameter together with the inwardly tapered portion concentrates OISF in the flared portion of the silicon crystal.

According to another aspect of the present invention, there is provided a method for producing a silicon crystal having minimal OISF defects. The method includes the steps of forming a silicon crystal top portion that has a first predetermined diameter. A next step is to inwardly taper the silicon crystal top portion to produce a cylindrical portion having a second predetermined diameter. The second predetermined diameter is smaller than the first predetermined diameter by a predetermined amount. The process includes the step of forming an inwardly tapered portion for connecting the top portion to the cylindrical portion. Another step of this aspect of the invention is to lower the interfacial temperature of the forming silicon crystal at the top portion. The second predetermined diameter is of a sufficient size to form a cylindrical portion of the silicon crystal. In the present invention, nucleation sites concentrate in the top portion of the silicon crystal. The cylindrical portion of the silicon crystal is, therefore, free of OISF defects.

A technical advantage of the present invention is that it eliminates OISF defects in silicon crystals during Czochralski crystal growth by overgrowing the top portion of the silicon crystal and by simultaneously lowering the interfacial temperature between the silicon crystal and molten silicon. The present invention provides a method for simultaneous control of the melt temperature and the crystal growth conditions. The top portion of the silicon crystal flares considerably larger than the desired diameter of the crystal. After flaring the top of the crystal, the crystal diameter is sharply cut into the desired crystal diameter. Lowering the melt temperature enables faster solidification and establishes a melt/crystal interface that avoids OISF. In the preferred embodiment of the present invention, an increase of 10% over the second predetermined diameter is acceptable. Melt and crystal interface shapes that are slightly concave with respect to the solid are preferred because dislocations migrate toward the surface of the crystal.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF ILLUSTRATIVE EMBODIMENTS

The illustrative embodiments of the present invention are best understood by referring to the FIGUREs wherein like numerals are used for like and corresponding parts of the various components.

The present embodiment controls seed and crucible rotation rates, seed lift rates, and process temperatures within certain bounds to control oxygen precipitation and to reduce or eliminate oxygen micro-defects that cause oxidation-induced stacking faults (OISF) in silicon crystals.

A problem in the growth of silicon crystals is the control of oxygen concentration and precipitation to obtain beneficial effects that the presence of oxygen brings while minimizing the detrimental effects of oxygen in the silicon crystal. For example, under certain growth conditions, bands of oxygen micro-defects form that later produce OISF. The present embodiment addresses the problem of oxygen precipitation control and minimization of OISF while maintaining crystal quality in these other factors.

The present embodiment controls the seed and crucible rotation rates and seed lift rate in such a way as to shape the first part of the growing crystal to assume first an oversized diameter and then an inwardly tapered shape. The method keeps the rotation and seed lift rates within certain bounds to control oxygen precipitation. Normal Czochralski silicon crystal growth processes directly taper the sides of the crystal from the smaller diameter seed to the desired diameter of crystal cylindrical portion. Thus, as the seed withdraws from the molten silicon, the silicon crystal forms by continuously increasing in diameter until the crystal reaches the desired cylindrical portion diameter. Thereafter, the conventional Czochralski technique is to maintain the cylindrical portion diameter within a predetermined range to form the silicon crystal. When this is done, however, OISF occurs in the crystal's cylindrical portion. The present embodiment minimizes OISF generation by forming a large diameter top portion and a reverse taper in the top portion part of the silicon crystal.

Figure 1:
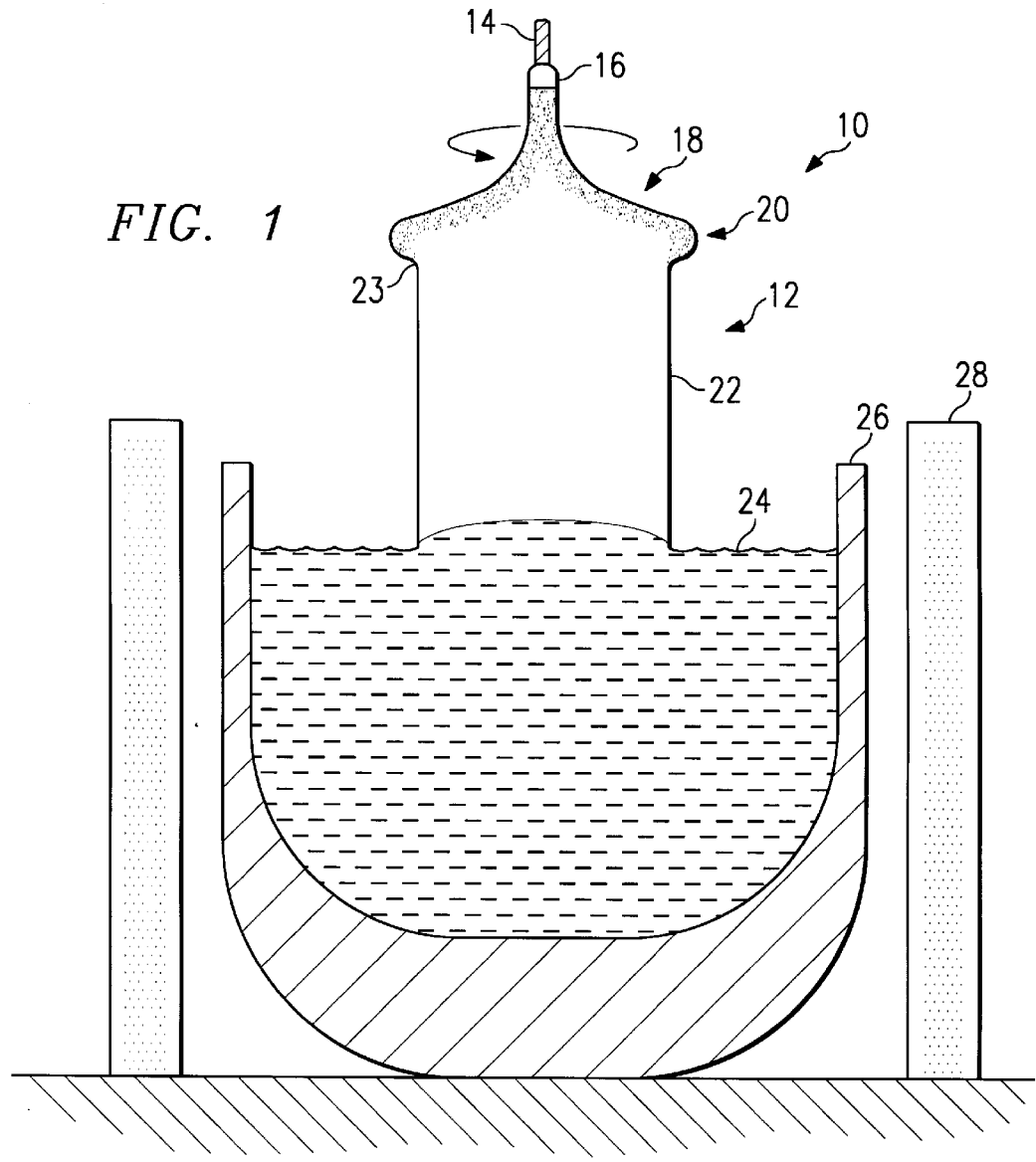
FIG. 1 provides a conceptual view of a fixture for growing a silicon crystal according to the Czochralski technique and with which to implement the present embodiment.

Referring to FIG. 1, there appears a Czochralski silicon crystal-forming device 10 which forms silicon crystal 12. Silicon crystal 12 attaches to pulling device 14 through seed 16 that is within or integral to crystal top portion 18. Silicon crystal top portion 18, in the present embodiment, has an enlarged diameter 20 that is greater than the cylindrical portion 22 diameter. Silicon crystal 12 includes inwardly tapered portion 23 that connects to cylindrical portion 22. Silicon crystal 12, including top portion 18, inwardly tapered portion 23, and cylindrical portion 22 form from molten silicon 24 that susceptor 26 holds and heating element 28 heats.

The conventional Czochralski silicon crystal growing technique is well-known in the prior art. The present embodiment, however, significantly modifies the conventional Czochralski technique to eliminate or minimize both OISF and oxygen precipitation. Inwardly tapered portion 23 cuts off or limits OISF formation in cylindrical portion 22. The result is that OISF does not appear in cylindrical portion 22.

Figure 2A:
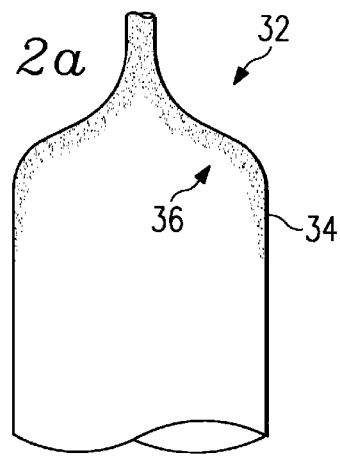
FIGS. 2a and 2b provide views of a silicon crystals formed without and with, respectively, the method of present embodiment.
Figure 2B:
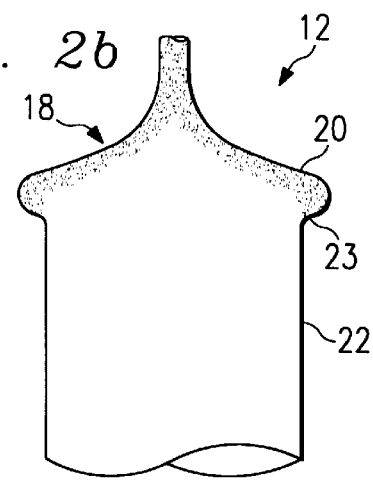

FIGS. 2a and 2b conceptually depict X-ray photography results that illustrate the difference between silicon crystal 32 in FIG. 2a that the conventional Czochralski process forms and silicon crystal 12 in FIG. 2b that the method of the present embodiment forms. Thus, in silicon crystal 32, OISF appears along the cylindrical side 34 in the form of speckled or shaded area 36. In contrast, silicon crystal 12 that the present embodiment forms concentrates OISF within enlarged top portion 20. Inwardly tapered portion 23 prevents OISF from coming into the cylindrical region 22 and improves the purity of the cylindrical portion 22.

There are numerous ways to form the desired silicon crystal 12. One way is described below in conjunction with Table 1. The present embodiment, however, also addresses the problem of controlling oxygen precipitation at the bottom portion of silicon crystal 12. Therefore, before explaining in greater detail how the preferred embodiment avoids OISF, the following description explains the oxygen precipitation features of the present invention.

Figure 3A:
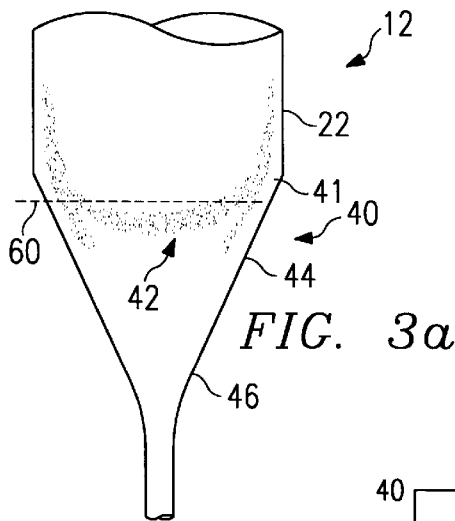
FIGS. 3a, 3b and 3c illustrate and describe characteristics of the phenomenon of oxygen precipitation and its presence at the bottom portion of a silicon crystal grown according to a conventional Czochralski technique.
Figure 3B:
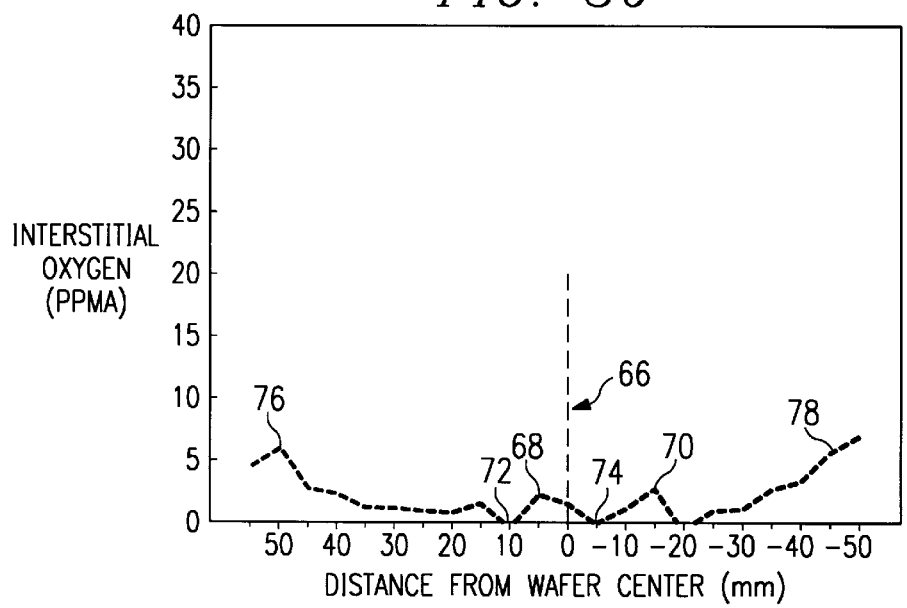
Figure 3C:
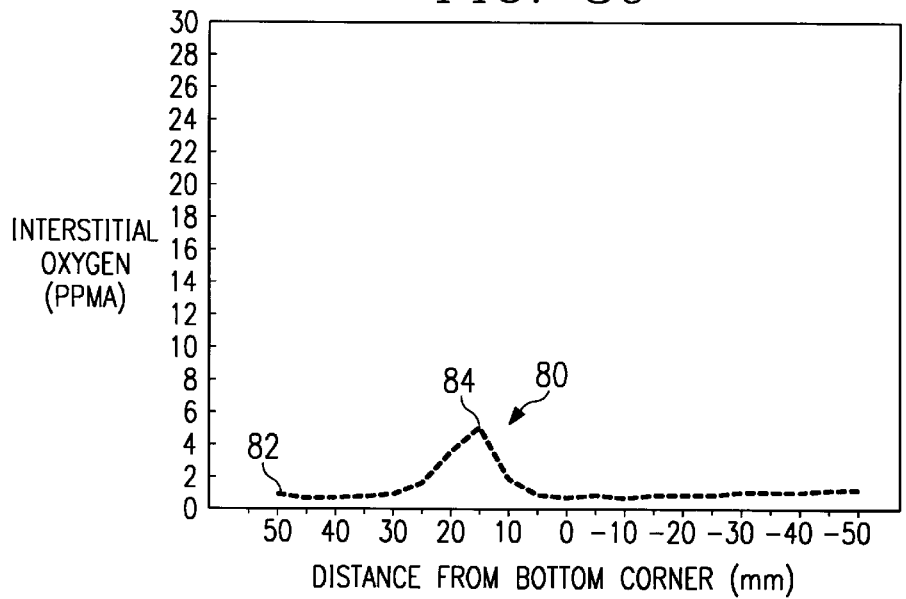

FIGS. 3a, 3b and 3c illustrate the phenomenon of oxygen precipitation that occurs in bottom portion 40 of silicon crystal 12. In particular, FIG. 3a conceptually shows the results of an X-ray photograph of bottom portion 40 that illustrates the characteristics of oxygen precipitation region 42. Bottom portion 40 begins at bottom corner 41 and has a conical side wall 44 that tapers continuously and at a constantly decreasing rate to endpoint 46.

FIG. 3b plots interstitial oxygen in parts per million atoms (ppma) against distance from the wafer center in millimeters (mm). Line 58 represents general measurements of interstitial oxygen as determined by X-ray photography. The measurements along the horizontal axis 60 (FIG. 3a) of bottom portion 40 show that at wafer center point 66, interstitial oxygen appears in differing amounts. For example, high points 68 and 70 are interspersed with low points 72 and 74.

At the horizontal edges of the bottom portion 40, interstitial oxygen peaks 76 and 78 occur.

FIG. 3c shows the results of scanning bottom portion 40 for interstitial oxygen caused by oxygen precipitation. The scan begins at cylindrical portion 22 and proceeds along sloping portion 44 to bottom portion 46. FIG. 3c shows in line 80 that interstitial oxygen levels are low at level 82 until they increase to peak 84, which represents the presence of interstitial oxygen. The horizontal axis of FIG. 3c shows that prior to reaching bottom corner 41 oxygen precipitation occurs. Therefore, in the FIG. 3c measurement, interstitial oxygen exists at approximately 25 millimeters from corner 41 and continues to exist until approximately 5 millimeters from corner 41.

Figure 4A:
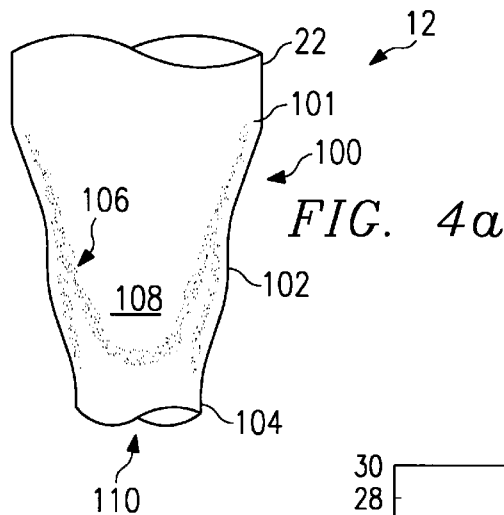
FIGS. 4a, 4b, and 4c illustrate oxygen precipitation in a silicon crystal formed according to the present embodiment.
Figure 4B:
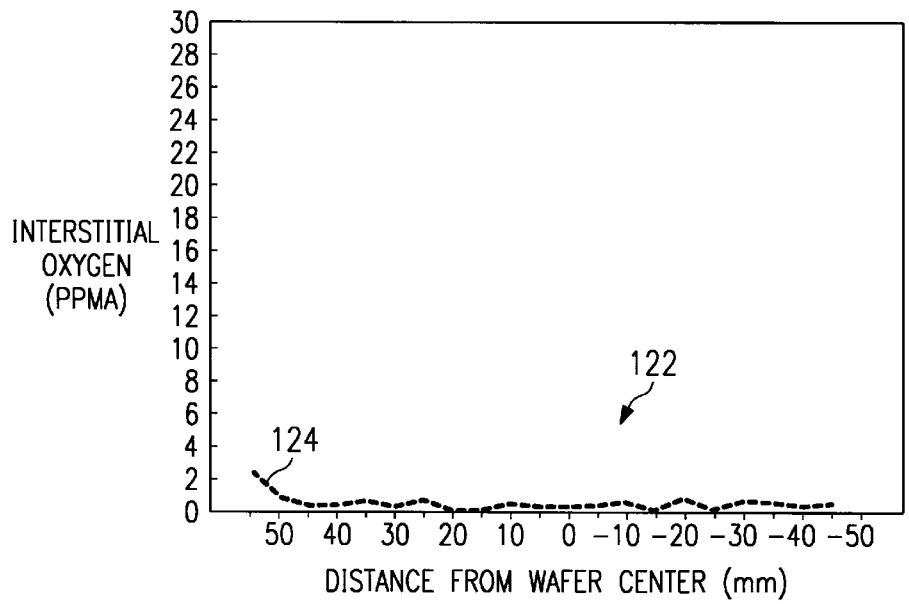
Figure 4C:
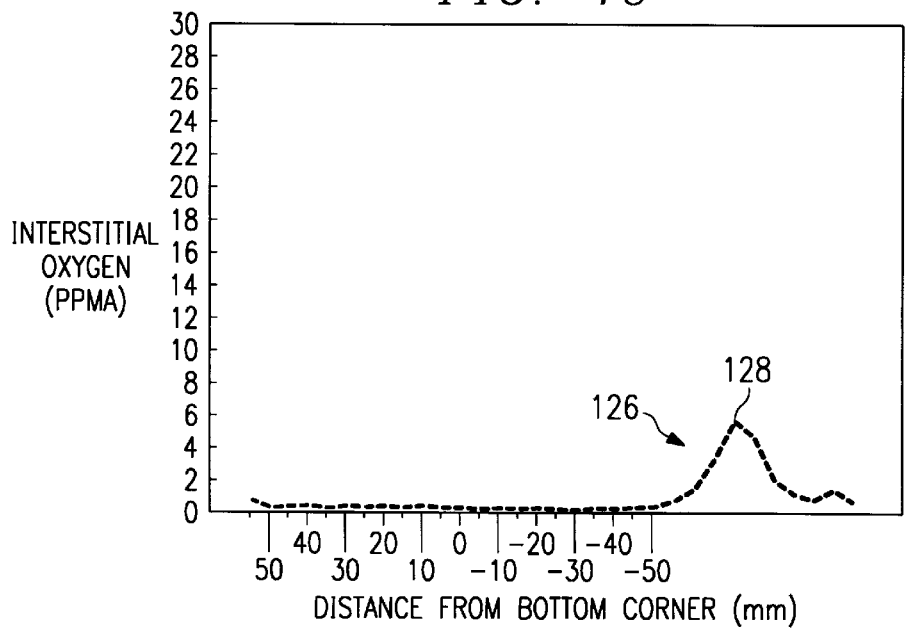

FIGS. 4a, 4b, and 4c show results obtained from the present embodiment of the invention. In particular, FIG. 4a shows modified silicon crystal bottom portion 100 with cascading side wall 102 that tapers to tip 104. Cascading side wall 102 originates at bottom corner 101 from cylindrical portion 22. Thus, in the present embodiment, side wall 102 cascades from the cylindrical portion 22 to tip 104. In bottom portion 100, oxygen precipitation region 106 primarily concentrates in cascade middle portion 108. This moves oxygen precipitation region 106 essentially out of cylindrical region 22.

FIG. 4b shows an X-ray scan that indicates the elimination of oxygen precipitation region from cylindrical portion 22. In particular, FIG. 4b shows the flat response of line 122 that indicates no interstitial oxygen in an X-ray cross-section 120 of cylindrical portion 22. Similarly, FIG. 4c shows a vertical scan beginning in cylindrical portion 22 and continuing through bottom portion 100 to illustrate that oxygen precipitation region 106 moves further below bottom corner 101. When compared to peak region 84 of line 80 (FIG. 3c), it is clear that interstitial oxygen has moved down considerably downward in bottom portion 100 of silicon crystal 12 as shown by peak 128 of line 126.

Figure 5:
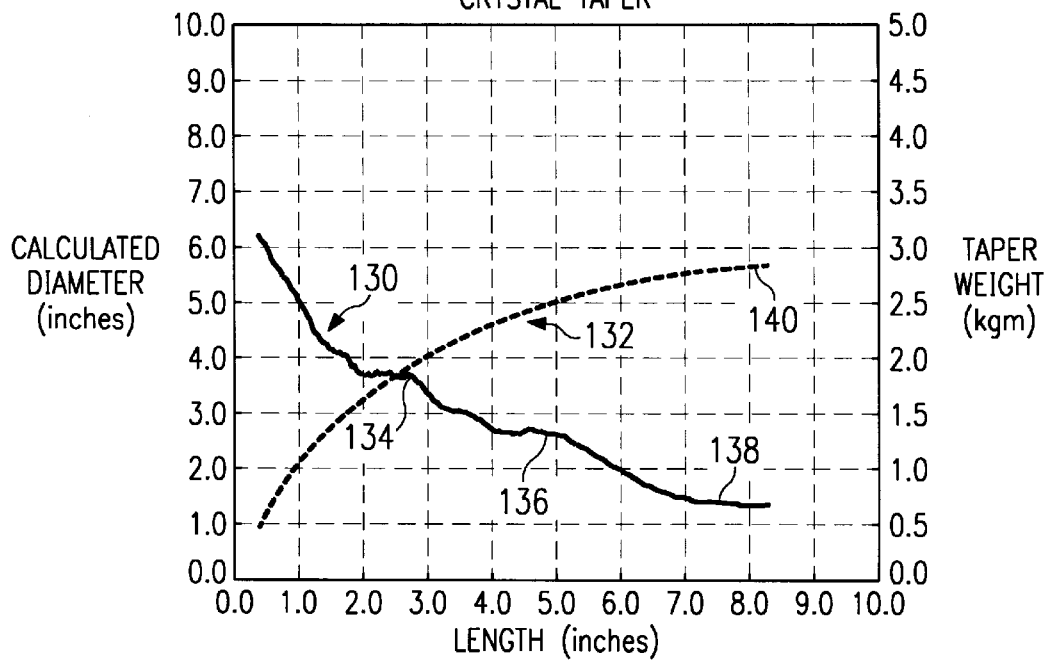
FIG. 5 provides plots of calculated diameter versus crystal length, and taper weight versus crystal length to show how the present embodiment modifies the conventional Czochralski silicon crystal growing technique.
Figure 6:
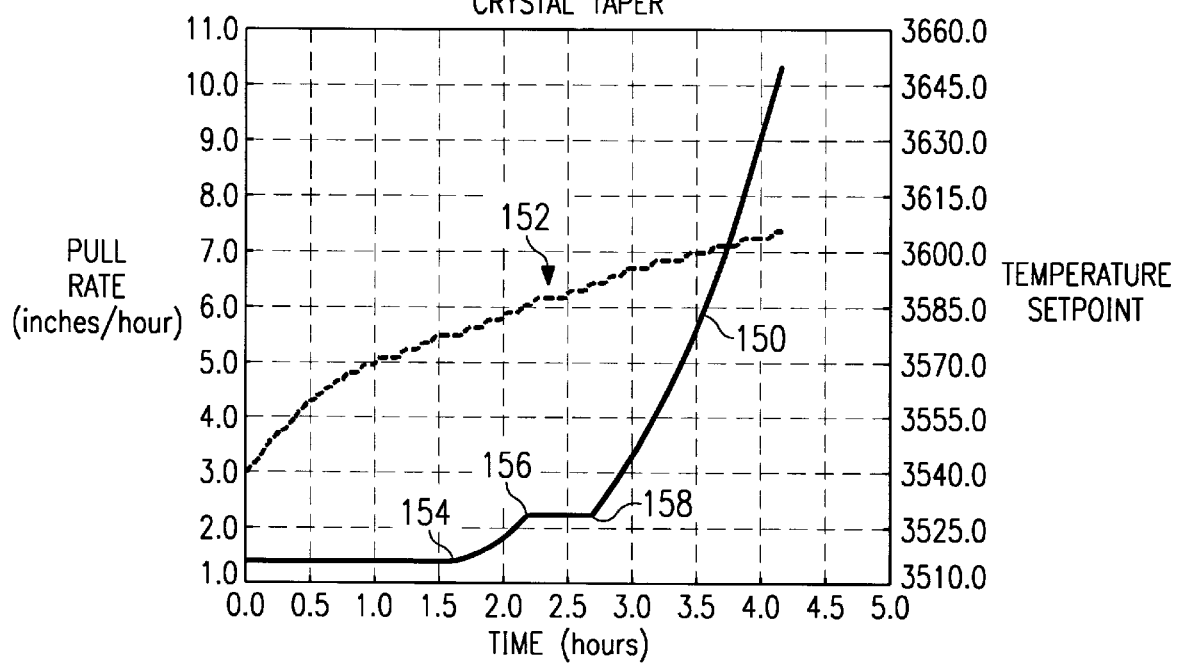
FIG. 6 shows plots of pull rate versus time, and temperature setpoint versus time to further illustrate how the present embodiment modifies the conventional Czochralski silicon crystal growing technique.

FIGS. 5 and 6 plot parameters associated with the process of forming bottom portion 100 of silicon crystal 12. In FIG. 5, solid line 130 represents calculated diameter in inches of bottom portion 100. Dashed line 132 represents the taper weight in kilograms mass (kgm) of bottom portion 100. As FIG. 5 shows, the present embodiment first begins at a diameter of 150 millimeters (i.e., approximately 6.2 inches) that corresponds to the diameter of cylindrical portion 22. Silicon crystal 12 bottom portion 100 tapers to intermediate diameter 134 that corresponds to intermediate portion 108 of bottom portion 100. Diameter 136 of approximately 2.25 inches corresponds to tip 104. End diameter 138 corresponds to end 110 of bottom portion 100. Note that as diameter line 130 cascades downward, although the taper weight is increasing, it increases at a decreasing weight ending at taper weight 140 of approximately 2.8 kgm.

FIG. 6 explains in greater detail the process of forming bottom portion 100 by plotting pull rate of seed 16 versus process time as line 150. Line 152 plots the temperature set point of the process versus the same process time as appears in line 150. In line 150, the pull rate is constant at a rate of approximately 1.4 inches per hour until point 154. At point 154, time of the pull rate increases to approximately 2.2 inches per hour at point 156. The pull rate then remains constant for a predetermined time until point 158. At point 158, the pull rate increases rapidly until bottom portion 100 separates from molten silicon 24 (FIG. 1). While the pull rate adjustments occur in the present embodiment, the temperature set point increases from approximately 3540° F. to approximately 3605° F.

As FIG. 6 shows, by simultaneously controlling the pull rate and temperature set point, the present embodiment achieves the calculated diameter and taper weight properties of FIG. 5. Increasing the pull rate rapidly at point 154 and then holding the pull rate constant at point 156 until point 158 forms the cascaded middle portion 108 of bottom portion 100. This modification of the conventional Czochralski silicon crystal growth process moves oxygen precipitation region 106 in to middle region 108. This, consequently, eliminates oxygen precipitation from cylindrical region 22 to yield a more pure silicon crystal.

A technical advantage of the present invention is that the combination of eliminating OISF and eliminating oxygen precipitation in the cylindrical portion of silicon crystal 12 eliminates the need to dispose of as much as two-thirds of the silicon single wafer 12. By forming larger diameter top portion 18, the layer of oxygen that causes OISF in the conventional Czochralski technique moves above and outside cylindrical portion 22 of silicon crystal 12. Likewise, forming cascaded bottom portion 100 moves oxygen precipitation away from the cylindrical portion of silicon crystal 12.

Another technical advantage of the present invention is that the cascaded taper of bottom portion 100 uses only slightly more silicon and takes only a minimal amount move time to form than does the uniformly decreasing taper end of conventional Czochralski technology. This, however, is a small expense relative to the benefit of producing significantly more of the usable part of silicon crystal 12.

OPERATION

Having described the method and apparatus for performing the present embodiment, its operation is readily apparent. For completeness, however, the following provides an explanation of one way to practice the invention. Using Czochralski silicon crystal forming reactor 10 as FIG. 1 depicts or some other similar reactor for forming silicon crystal 12, a predetermined amount of bulk silicon is loaded into susceptor 26. The bulk silicon is melted by heater 28 to a predetermined process temperature consistent with known Czochralski crystal growing techniques to form molten silicon 24. Then, heater 24 stabilizes the molten silicon 24 temperature. The next step is to insert seed 16 into molten silicon 24. Seed 16 fuses with a portion of molten silicon 24. Pulling cable 14 raises seed 16 and cooling the adhering silicon takes place at a prescribed rate known in the Czochralski technique. These steps are well known in art and form the basis for the novel concepts of the present invention.

As seed 16 withdraws at a prescribed rate, silicon crystal 12 begins to grow. As single silicon crystal 12 grows, the lift rate increases to control the amount of solidification that occurs. In the present embodiment, solidification increases to the point where top portion 20 grows to a greater diameter than the desired cylindrical portion of silicon crystal 12. Once at the greater diameter, inwardly tapered portion 23 is formed to trap oxygen micro-defects and the associated OISF in top portion 18. The rate of withdrawal of seed device 16 and the associated silicon crystal 12 is then controlled to achieve and maintain a desired degree of uniformity in cylindrical portion 22. However, the length of the cylindrical portion 22 may be computer-controlled so that the formation of bottom portion 100 only occurs after reaching a prescribed length for cylindrical portion 22. After cylindrical portion 22 reaches a desired length, formation of bottom portion 100 occurs according to the procedures that FIGS. 5 and 6 outline. This forces oxygen precipitation into bottom portion 100 and away from the cylindrical portion 22.

The resulting silicon crystal 12, therefore, includes not only flared top portion 18, as FIGS. 1 and 2b show, that locates OISF regions away from cylindrical portion 22, but also bottom portion 100, as FIG. 4a shows, that moves oxygen precipitation region 106 away from cylindrical portion 22. The result is a significantly improved silicon crystal that has pure silicon with neither OISF or oxygen precipitation in cylindrical portion 22.

In order to control both problems of OISF and oxygen precipitation, the present embodiment keeps the seed and crucible rotation rates and seed lift rate within certain bounds, depending on the depth of the heat zone, charge size, and crystal diameter.

The following example even further illustrates the differences in adjustable control parameters for obtaining the above-described technical advantages. Three examples of growing silicon crystal ingots are discussed here. One approach grows a silicon crystal without preventing OISF nucleation centers. Another approach grows silicon crystals in which OISF centers are reduced or eliminated. Yet another example grows in which both OISF and oxygen precipitation control are present.

There are any number of alternatives or changes in the method for controlling OISF in silicon crystals that may be readily apparent to one of ordinary skill in the art. Such alternatives may not be employed in the device of the present embodiment for any number of reasons, such as costs and performance considerations, size constraints, availability of materials, arbitrary design decisions, and the like. A number of these alternatives have been mentioned above. Thus, the present invention is intended to be limited only by the claims which are meant to cover such obvious alternatives and deviations from the preferred design.

What is claimed is:

1. A method for controlling oxygen precipitation in a silicon crystal grown according to the Czochralski silicon growing technique, the method comprising the steps of:
   forming a flared top portion of the silicon crystal to a first diameter;
   inwardly tapering the silicon crystal top portion to produce a cylindrical portion having a second diameter, said second diameter being smaller than said first diameter for concentrating OISF in the flared portion of the silicon crystal.

2. The method of claim 1 further comprising the step of forming said first diameter to 160 millimeters and said second diameter to 150 millimeters.

3. The method of claim 1 further comprising the step of forming said cylindrical portion to a length of approximately eight inches.

TABLE 1

| STAGE OF GROWTH | FIRST LEVEL NO OISF OR OXYGEN PRECIPITATION CONTROL | SECOND LEVEL OISF CONTROL | THIRD LEVEL OISF AND OXYGEN PRECIPITATION CONTROL |
| --- | --- | --- | --- |
| CONTROL SET-UP | Seed Rotation 12–15 rpm Crucible Rotation = 6–8 rpm Top growth seed lift = 1–1.2 in/hr | Seed Rotation = 16 rpm ± 0.1 Crucible Rotation ≥ 6 rpm Top growth seed lift ≥ 2 in/hr | Seed Rotation > 16 rpm Crucible Rotation ≤ 5 rpm Top gr seed lift ≤ 2 in/hr and ≤ 1.5 in/hr |
| CROWN GROWTH & ROLL | Not Applicable | Set temperature to achieve desired diameter within 45 min | Set seed lift to achieve diameter within 45 min. |
| ROLL | Initiate roll at desired diameter | Initiate roll at desired diameter plus 0.5 inch | Initiate roll at diameter + 0.5 inch |
| CYLINDERICAL PORTION SEED LIFT RATE | Seed lift = 4–6 in/hr | Seed lift = 8 in/hr | Seed lift = 8 in/hr |
| TOP PORTION SEED LIFT RATE | Not Applicable | Maintain seedlift of a minimum of 3.5 in/hr for first 3 inches of xtal | Seed lift 3.5 in/hr first 3 inches |
| REACH TARGET DIAMETER | As soon as possible; no reverse top taper | Within 1 inch after crown roll | Within 1 inch after crown roll |

The foregoing conditions were successfully tested on both 150 mm and 200 mm crystal growth. Similar conditions and bounds will undoubtedly exist for growing silicon crystals having smaller and larger diameter.

In summary, the present invention provides a method for controlling OISF in silicon crystals grown according to the Czochralski silicon crystal growing technique by modifying the Czochralski technique. The modification includes the step of forming a flared top portion on the silicon crystal. The flared top portion has a predetermined diameter that is greater than the desired diameter of the silicon crystal cylindrical portion. The method forms an inwardly tapered portion of the silicon crystal that separates the cylindrical region from flared top portion.

4. The method of claim 1, further comprising the step of controlling the crucible rotation rate in forming the silicon crystal to a speed of not less than five revolutions per minute.

5. The method of claim 1, further comprising the step of controlling the rate of forming the flared top portion to have a lift rate of not less than two inches per hour.

6. The method of claim 1, further comprising the step of controlling the seed lift rate to form the cylindrical portion of the silicon crystal at a rate of at least 3.5 inches per hour.

7. A method for producing a silicon crystal, comprising the steps of rotating the crucible for containing molten silicon at a speed of not less than six revolutions per minute;

forming a flared top portion for the silicon single ingot at a top growth seed lift rate of not less than two inches per hour;

establishing the temperature of the molten silicon to achieve a desired first diameter within forty-five minutes;

initiating a role of the seed at the cylindrical portion diameter plus 0.5 inches;

maintaining a seed lift rate of approximately 8 inches per hour;

maintaining a seed lift of a minimum of 3.5 inches per hour for the first 3 inches of growth; and maintaining a target diameter for the cylindrical portion of silicon crystal within 1 inch after beginning a crown role.

8. The method of claim 7, further comprising the step of forming a cascaded taper on the bottom portion of the silicon crystal to localize oxygen precipitation away from the cylindrical portion of the silicon crystal.

* * * * *